United States Patent [19]

Mishiro

[11] 4,277,758

[45] Jul. 7, 1981

[54] ULTRASONIC WAVE GENERATING APPARATUS WITH VOLTAGE-CONTROLLED FILTER

[75] Inventor: Shoji Mishiro, Kawasaki, Japan

[73] Assignee: Taga Electric Company, Limited, Tokyo, Japan

[21] Appl. No.: 65,161

[22] Filed: Aug. 9, 1979

[51] Int. Cl.³ .............................................. H03L 7/00
[52] U.S. Cl. ............................... 331/1 R; 331/116 M; 331/25; 310/316
[58] Field of Search ............... 331/1 R, 26, 116 R, 331/116 M, 4, 25; 310/316, 116, 311

[56] References Cited

U.S. PATENT DOCUMENTS

| | | | |
|---|---|---|---|
| 2,752,512 | 6/1956 | Sarratt | 310/8.1 |
| 2,917,691 | 12/1959 | Prisco et al. | 318/118 |
| 3,889,166 | 6/1975 | Scurlock | 310/316 |
| 3,931,533 | 1/1976 | Raso et al. | 310/8.1 |
| 3,967,143 | 6/1976 | Watanabe et al. | 310/316 |
| 3,975,650 | 8/1976 | Payne | 310/8.1 |

Primary Examiner—David K. Moore
Attorney, Agent, or Firm—Oblon, Fisher, Spivak, McClelland & Maier

[57] ABSTRACT

The present invention deals with an ultrasonic wave generating apparatus with voltage controlled filter, comprising a phase comparator which detects a shifted value from a predetermined phase difference between a driving voltage or a driving current of an ultrasonic transducer and a vibratory velocity signal, and a voltage-controlled band-pass filter which is controlled by the output of the phase comparator and which is provided in a feedback loop from the vibratory velocity signal to an input of a driving amplifier of the ultrasonic transducer, wherein the oscillating frequency is changed while following the resonant frequency of the ultrasonic transducer, so that stable operation is materialized without developing abnormal oscillation in sub-resonant frequencies and permitting very small following error.

5 Claims, 4 Drawing Figures

ULTRASONIC WAVE GENERATING APPARATUS WITH VOLTAGE-CONTROLLED FILTER

DESCRIPTION OF THE INVENTION

The present invention relates to an ultrasonic wave generating apparatus with voltage-controlled filter which will be operated in a state of maximum efficiency by permitting the oscillating frequency of an oscillating device which drives an ultrasonic transducer to follow a resonant frequency of the ultrasonic transducer.

In general, ultrasonic transducers employed for the ultrasonic appliances have their own mechanical resonant frequencies, and should desirably be operated at their resonant frequencies so that their electro-mechanical conversion efficiencies can be enhanced. The resonant characteristics, however, have high Q values. The Q values become great particularly when the amplitude of vibration is amplified using a horn, establishing sharp resonant characteristics. Moreover, in practice, the resonant frequencies are changed by the external conditions such as temperature at which the ultrasonic transducer is used, driving level and loading level, and by the horn or attached tool or chip employed for the ultrasonic machining apparatus. Therefore, the oscillating frequency of the driving oscillator must desirably follow the resonant frequency of the ultrasonic transducer.

For this purpose, a motional feedback oscillator has so far been widely employed by picking up vibratory velocity signals from the ultrasonic transducer by means of a vibration detector such as electro-strictive element, and by feeding back the thus picked up signals as input signals to the driving amplifier so that the resonant frequency of the ultrasonic transducer can be followed. Here, in addition to a fundamental resonant frequency, the ultrasonic transducer generates many other subresonant frequencies. Therefore, in order that the feedback oscillations will not be developed by the undesirable subresonant frequencies, a band-pass filter is contained in the feedback loop so that the oscillation takes place depending only upon the fundamental resonant frequency. According to the above method, however, when the resonant frequencies of the ultrasonic transducer are changed by the external conditions, the phase in the feedback loop is shifted by the band-pass filter causing the following ability to be degraded. Further, if the Q value of the band-pass filter is lowered to reduce the phase shift, abnormal oscillation tends to develop in the subresonant frequencies of the ultrasonic transducer.

Another method consists of detecting, by means of a phase comparator, a shifted value from a predetermined phase difference between a driving voltage or a driving current of the ultrasonic transducer and vibratory velocity signal, providing a voltage-controlled oscillator which will be controlled by the output of the phase comparator, and feeding the output signals of the voltage-controlled oscillator as inputs to the driving amplifier so that the oscillating frequency of the oscillator can be changed while following the resonant frequency of the ultrasonic transducer. The above system can be easily constructed using integrated circuits for phase locked loops, which are recently easily available. However, when regarded as a whole, the system requires a variety of accessory functional elements, resulting in complicated construction and giving disadvantage from the standpoint of cost.

Further, when a switching amplifier which produces a voltage of square waveforms is used as a driving amplifier for the ultrasonic transducer, higher harmonic components contained in the square waves flow in large quantity into a damped capacitance of the electro-strictive transducer creating spike-like sharp current, causing switching elements such as tansistors to be damaged when the amplifier is driven with increased electric power. In such a case, therefore, it will be necessary to insert a harmonic attenuation filter in the output side of the driving amplifier or to drive the driving amplifier with sinusoidal waves. However, if a resonant circuit consisting of a fixed coil and a capacitor, which is much dependent upon the frequency is inserted in the output side of the driving amplifier, the phase between the output voltage and the output current of the driving amplifier may shift when the driving frequency is changed following the resonant frequency of the transducer, causing not only the efficiency of the power driver to be decreased but also giving damage thereto. Hence, such a filter element should not be used as far as possible. Taking these points into consideration, the driving amplifier should inevitably be actuated with sinusodial waves, and the input signals applied thereto should also be of a sinusoidal waveform. In general, however, the outputs of the voltage-controlled oscillators take the form of square waves. In practice, therefore, the outputs of the oscillator have been shaped into sinusoidal waves before being fed to the driving amplifier. Usually, however, such a wave-shaping circuit is complex in construction because it must integrate the square waves into triangular waves and further integrate them to form sinusoidal waves. Besides, due to its frequency dependency, the integrating circuit decreases its output amplitude with the increase in frequency, presenting such a problem that it becomes difficult to obtain constant output voltage when the follower frequency changes over a wide range.

The present invention was accomplished in view of such respects, and its object is to provide an ultrasonic wave generating apparatus with voltage-controlled filter, which generally is set up in simple construction, and which changes the oscillating frequency while following the resonant frequency of the ultrasonic transducer.

Figure 1:
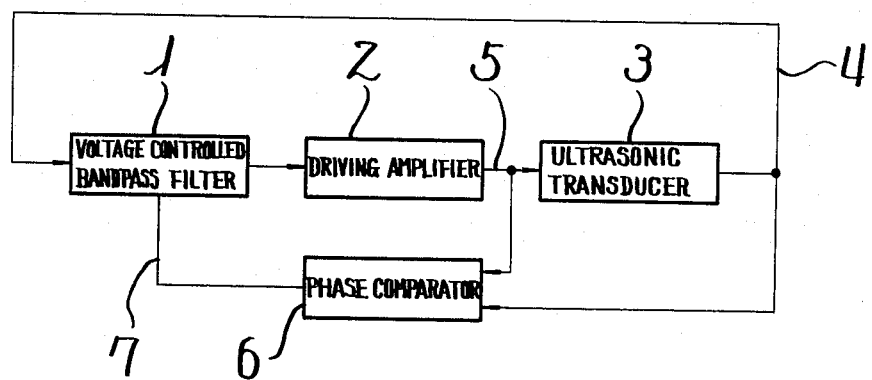
FIG. 1 and FIG. 2 are block diagrams showing the principle of the present invention.

An embodiment of the present invention is mentioned below in conjunction with the accompanying drawings. First, FIG. 1 is a block diagram showing the principle of a constant voltage driving type transducer, or the case when a magneto-strictive transducer is operated, in which reference numeral 1 denotes a voltage-controlled band-pass filter whose output will be amplified by a driving amplifier 2 and will be fed to an ultrasonic transducer 3. The ultrasonic transducer 3 generates mechanical vibration, and its vibratory velocity signals are fed as input signals to the voltage-controlled band-pass filter 1. There is further provided a phase comparator 6 which receives a driving voltage or a driving current 5 of the ultrasonic transducer 3 and the vibratory velocity signals 4. The resonant frequency of the voltage-controlled band-pass filter 1 is controlled by a d-c output voltage 7 produced by the phase comparator 6 in proportion to the shifted value from a predetermined phase difference. Therefore, the ultrasonic transducer 3 is driven at the resonant frequency since the resonant frequency of the voltage-controlled band-pass filter 1 is controlled and the phase in the feedback loop is controlled such that the phase difference between the driving voltage or the driving current 5 of the ultrasonic transducer 5 and the vibratory velocity signals 4 becomes a predetermined value.

Here, the ultrasonic transducer 3 needs not be limited to the magneto-strictive transducer but may be an electro-strictive transducer provided it is operated at a parallel resonant frequency thereof. Further, the vibratory velocity signals 4 may be detected by a customary manner, e.g., by installing a vibration detector element such as electro-strictive element in a mechanical vibration system, or by taking out the electric current flowing into the ultrasonic transducer 3, or by detecting the signals by way of an electric circuit. When the phase comparator 6 is of the type of quadrature in which the phase difference between the two inputs must be 90 degrees, a phase shifter may be inserted in one input thereof, as required. Further, as required, the output of the phase comparator 6 is passed through a d-c amplifier and a low-pass filter, and is used to control the voltage-controlled band-pass filter 1. Further, a phase shifter is suitably inserted in the feedback loop so that the loop phase will become zero at the resonant frequency of the ultrasonic transducer 3.

Figure 2:
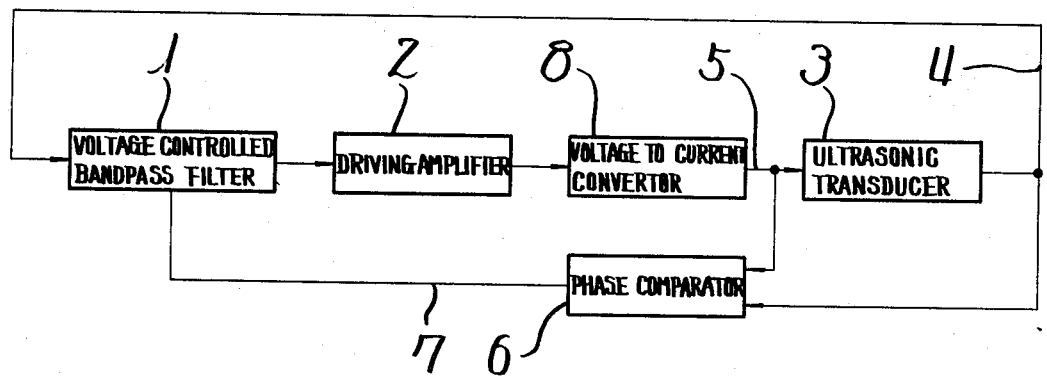

FIG. 2 is a block diagram showing a constant current driving type transducer or, generally, a transducer in which an electro-strictive transducer is actuated. Referring to FIG. 2, a voltage-to-current converter 8, i.e., an impedance inverter for converting a constant voltage driving source into a constant current driving source, is inserted between the driving amplifier 2 and the ultrasonic transducer 3 of FIG. 1, so that a constant vibratory velocity control can be effected when the load is varied while the ultrasonic transducer 3 or the electro-strictive transducer is being operated at a series resonant frequency.

Here, if the power source inclusive of the driving amplifier 2 is of the type of constant current driving source, the voltage-to-current converter 8 can be operated in the same manner by any other conventional means, for example, by controlling the amplitude of the driving amplifier 2 such that the vibratory velocity is constant, or by controlling the width of the output pulses by means of a switching amplifier, or by controlling the power supply voltage by means of a switching amplifier.

Figure 3:
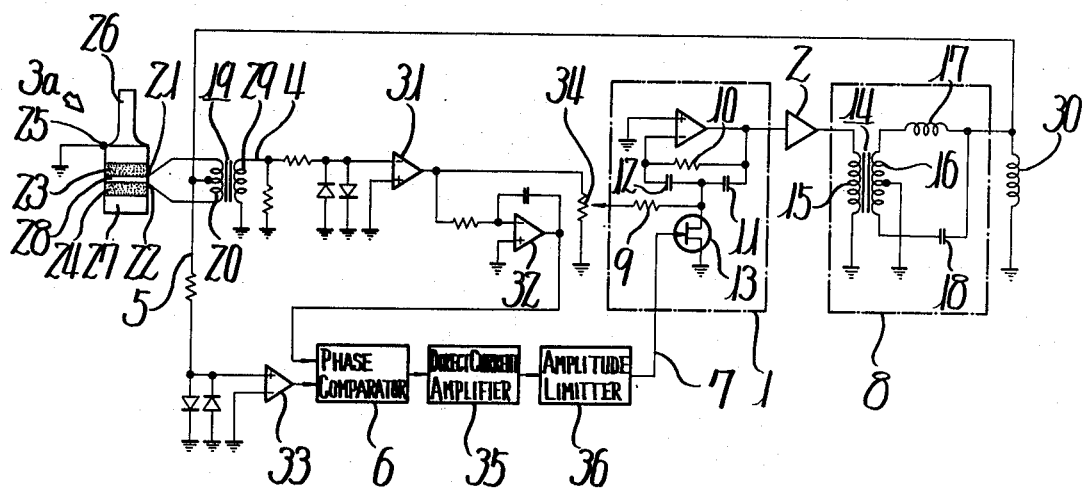
FIG. 3 is a circuit diagram embodying the present invention.

Below is mentioned a concrete example for driving the electro-strictive transducer in conjuction with FIG. 3. First, a bridged T filter is used as the voltage controlled band-pass filter 1 whose resonant frequency is determined by resistors 9, 10, capacitors 11, 12, and an internal resistance of a field effect transistor 13 which works as a variable resistor being controlled by a gate biasing voltage. Namely, the resonant frequency of the voltage controlled band-pass filter 1 is controlled by the gate biasing voltage applied to the field effect transistor 13. The output of the voltage controlled band-pass filter 1 is fed to the driving amplifier 2, amplified, and is fed to the voltage-to-current converter 8. The output voltage of the driving amplifier 2 is applied to a primary coil 15 of an output transformer 14, and a voltage produced on a secondary coil 16 of which the center tap has been grounded is taken out as voltages having phases different by 180°. After having passed through a coil 17 and a capacitor 18, the voltages are synthesized to produce a constant current output. Here, the coil 17 and the capacitor 18 are turned to the resonant frequency of an electro-strictive transducer 3a, a constant current output taken out from a connection point between the coil 17 and the capacitor 18 serves as a constant current proportional to the output voltage of the driving amplifier 2 and differentially flows into a primary coil 20 of the vibratory velocity detector transformer 19. Further, the current flows from positive electrode plates 21, 22 into electro-strictive elements 23, 24, and the resulting current returns from a negative terminal 25 to a center tap of the secondary coil 16 of the output transformer 14.

The electro-strictive transducer 3a has an insulator 28 sandwitched by the positive electrode plates 21, 22 between electro-strictive elements 23 and 24 which are further sandwitched by an exponentially stepped solid vibratory member 26 and another solid vibratory member 27, the whole setup being fastened by means of a bolt at a central portion. Here, the electro-strictive elements 23, 24 have been disposed at positions where the resonant vibratory stresses along the longitudinal axis of the electro-strictive transducer 3a are different from each other. Therefore, dissimilar motional currents flow into the electro-strictive elements 23 and 24. Besides, the same current flows into the damped capacitances of the electro-strictive elements 23, 24. Therefore, the difference in currents flowing into the electro-strictive elements 23 and 24 is detected by the vibratory velocity detector transformer 19, whereby a driving voltage produced on the secondary coil 29 serves as a vibratory velocity signal 4. Further, a coil 30 is connected in parallel with the electro-strictive transducer 3a to conjugate-match the damped capacitance of the electro-strictive transducer 3a thereby to offset the damping current. The amplitude of the vibratory velocity signal 4 is limited by a diode, concerted into a square wave by a comparator 31, shifted for its phase by 90° by means of an integrator 32 such that the inputs to the phase comparator 6 will have a phase difference of 90°, and is fed to one input terminal of the phase comparator 6. Further, the amplitude of the driving voltage 5 is limited by a resistor and a diode, converted into a square wave by a comparator 33, and is fed to the other input terminal of the phase comparator 6. Furthermore, the vibratory velocity signal 4 taken out by the comparator 31 in the form of the square wave is adjusted to a suitable level by a variable resistor 34, and is fed to the voltage-controlled band-pass filter 1.

The phase comparator 6 produces an output which is proportional to a value shifted from 90° which is a predetermined phase difference between the vibratory velocity signal 4 and the driving voltage 5. The output is then amplified to a suitable level by means of a d-c amplifier 35, and the amplitude thereof is so limited by an amplitude limiter 36 that the varying range of resonant frequency of the voltage controlled band-pass filter 1 will not extend to subresonant frequencies of the electro-strictive transducer 3a. Thereafter, the output is fed to the field effect transistor 13 which controls the resonant frequency of the voltage controlled band-pass filter 1.

Owing to the function of the voltage-to-current converter 8, the transducer drive current becomes a constant current according to an input voltage to the voltage-controlled band-pass filter 1, i.e., according to a value set by the variable resistor 34, whereby the electro-strictive transducer 3a vibrates at a constant amplitude irrespective of the magnitude of the load.

The output voltage of the phase comparator 16 controls the resonant frequency of the voltage-controlled band-pass filter 1 via the d-c amplifier 35 and the amplitude limiter 36 so that the phase difference between the driving voltage 5 and the vibratory velocity signal 4 will become zero, and so that the oscillating frequency established by the driving amplifier 2, voltage-to-current converter 8, electro-strictive transducer 3a, vibratory velocity signal 4, comparator 31 and a feedback loop to the input of the voltage-controlled band-pass filter 1, will always be the resonant frequency of the electro-strictive transducer 3a.

Here, if the comparator 31 has a sufficiently great degree of amplification so as to acquire a level of saturated output even with a small level of input signals, the oscillation will not be stopped even when heavy load is exerted on the electro-strictive transducer 3a. Further, good rise of oscillation will be obtained even under heavy load condition, presenting practicable functions.

Thus, according to the ultrasonic wave generating apparatus of the present invention, the voltage controlled band-pass filter 1 which works as an element for determining the oscillating frequency is inserted in the feedback loop, and the resonant frequency of the voltage controlled band-pass filter 1 is so controlled that the phase difference between the driving voltage or driving current 5 of the ultrasonic transducer 3 and the vibratory velocity signal 4 approaches a setpoint value. Accordingly, the ultrasonic transducer can be stably operated permitting very small following error. Further, even when the signals of square waves or triangular waves are directly fed to the voltage-controlled band-pass filter 1, the apparatus of the invention inevitably acquires frequency selective characteristics, making it possible to obtain output voltages of sinusoidal waves with less distortion, without at all requiring wave shaping circuit.

Figure 4:
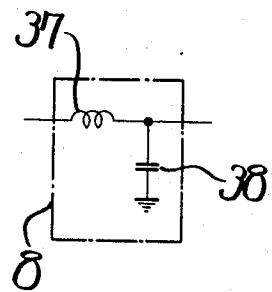
FIG. 4 is a circuit diagram in which the circuit of FIG. 3 is partly modified.

A widely known impedance inverter shown in FIG. 4 may also be employed as the voltage-to-current converter 8. In this case, if the series resonant frequency of the coil 37 and the capacitor 38 is roughly tuned to the resonant frequency of the electro-strictive transducer 3a, and if the electro-strictive transducer 3a is connected in parallel with the capacitor 38, a constant motional current flows into the electro-strictive transducer 3a so that it vibrates with a constant amplitude. This can be utilized as the voltage-to-current converter 8 of FIG. 3.

According to the present invention as mentioned above, the voltage-controlled band-pass filter that works as an element for determining the oscillating frequency is inserted in the feedback loop, and the resonant frequency of the voltage-controlled band-pass filter is so controlled that the phase difference between the driving voltage or driving current of the ultrasonic transducer approaches the setpoint value. Therefore, the whole setup can be simplified yet providing stable ultrasonic transducing function permitting very small following error. Besides, since the voltage-to-current converter is inserted between the ultrasonic transducer and the driving amplifier, good operation can be obtained even when the electro-strictive transducer is used as the ultrasonic transducer.

What is claimed is:

1. An ultrasonic wave generating apparatus comprising:
   ultrasonic transducer means for producing ultrasonic waves and a vibratory velocity signal;
   driving amplifier means for driving said ultrasonic transducer means;
   phase comparator means for comparing the output of said driving amplifier means with the said vibratory velocity signal for detecting a shifted value from a predetermined phase difference and producing a phase difference signal in response thereto;
   a voltage controlled band-pass filter means, said phase difference signal controlling said voltage controlled band-pass filter means;
   said voltage controlled band-pass filter means being directly connected to said vibratory velocity signal in a feedback loop.

2. An ultrasonic wave generating apparatus according to claim 1, wherein said voltage controlled band-pass filter means is a bridged T filter.

3. An ultrasonic wave generating apparatus comprising:
   ultrasonic transducer means for producing ultrasonic waves and a vibratory velocity signal;
   driving amplifier means for driving said ultrasonic transducer means;
   a voltage to current converter inserted between said ultrasonic transducer means and said driving amplifier means;
   phase comparator means for comparing the output of said driving amplifier means with the said vibratory velocity signal for detecting a shifted value from a predetermined phase difference and producing a phase difference signal in response thereto;
   a voltage controlled band-pass filter means, said phase difference signal controlling said voltage controlled band-pass filter means;
   said voltage controlled band-pass filter means being directly connected to said vibratory velocity signal in a feedback loop.

4. An ultrasonic wave generating apparatus according to claim 3, wherein said voltage-controlled band-pass filter means is a bridged T filter.

5. An ultrasonic wave generating apparatus according to claim 3 or 4, wherein said ultrasonic transducer is an electro-strictive transducer.

* * * * *